US005216721A

United States Patent [19]
Melton

[11] Patent Number: 5,216,721
[45] Date of Patent: Jun. 1, 1993

[54] MULTI-CHANNEL ACTIVE ACOUSTIC ATTENUATION SYSTEM

[75] Inventor: Douglas E. Melton, Stoughton, Wis.

[73] Assignee: Nelson Industries, Inc., Stoughton, Wis.

[21] Appl. No.: 691,557

[22] Filed: Apr. 25, 1991

[51] Int. Cl.[5] .......... H03B 29/00
[52] U.S. Cl. .......... 381/71; 381/94
[58] Field of Search .......... 381/71, 72, 94

[56] References Cited

U.S. PATENT DOCUMENTS

| | | | |
|---|---|---|---|
| 4,677,676 | 6/1987 | Eriksson . | |
| 4,677,677 | 6/1987 | Eriksson . | |
| 4,736,431 | 4/1988 | Allie et al. . | |
| 4,815,139 | 3/1989 | Eriksson et al. | 381/71 |
| 4,837,834 | 6/1989 | Allie . | |
| 4,987,598 | 1/1991 | Eriksson . | |
| 5,033,082 | 7/1991 | Eriksson et al. | 381/71 |
| 5,105,377 | 4/1992 | Ziegler, Jr. . | |

OTHER PUBLICATIONS

"An Adaptive Algorithm for IIR Filters Used in Multichannel Active Sound Control Systems", Elliot et al., Institute of Sound and Vibration Research Memo 681, Feb. 1988.

"Active Adaptive Sound Control In A Duct: A Computer Simulation", J. C. Burgess, Journal of Acoustic Society of America, 70(3), Sep., 1981, pp. 715-726.

"An Adaptive Algorithm For IIR Filters Used In Multichannel Active Sound Control Systems", Elliott et al., Institute of Sound And Vibration Research Memo No. 681, University of Southampton, Feb. 1988.

"Development Of The Filtered-U Algorithm For Active Noise Control", L. J. Eriksson, Journal of Acoustic Society of America, 89(1), Jan., 1991, pp. 257-265.

*Primary Examiner*—Jin F. Ng
*Assistant Examiner*—Edward Lefkowitz
*Attorney, Agent, or Firm*—Andrus, Sceales, Starke & Sawall

[57] ABSTRACT

A multi-channel active acoustic attenuation system has a plurality of adaptive filter channel models each of which is intraconnected to each of the remaining channel models such that each channel model has a model input from each of the remaining channel models. The correction signal from each model output to the respective output transducer is also input to each of the remaining channel models, and each channel model has an error input from each error transducer. A generalized system is provided for complex acoustic fields.

35 Claims, 5 Drawing Sheets

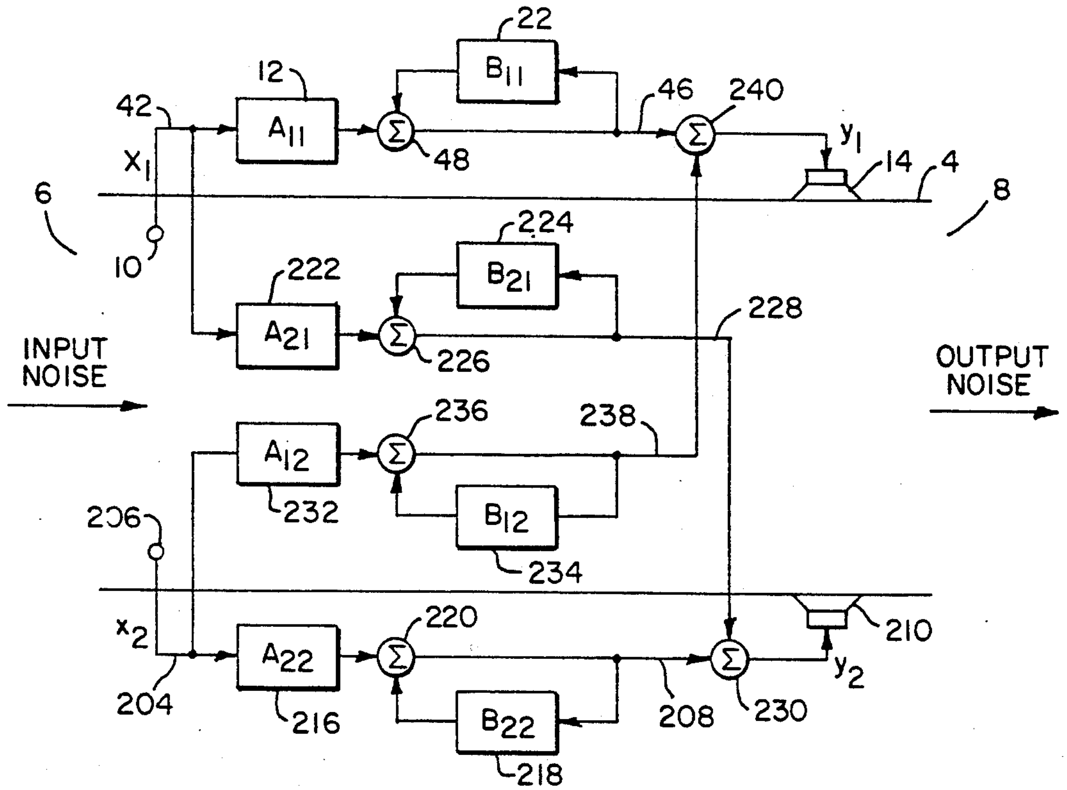
FIG. 6
PRIOR ART
FIG. 7
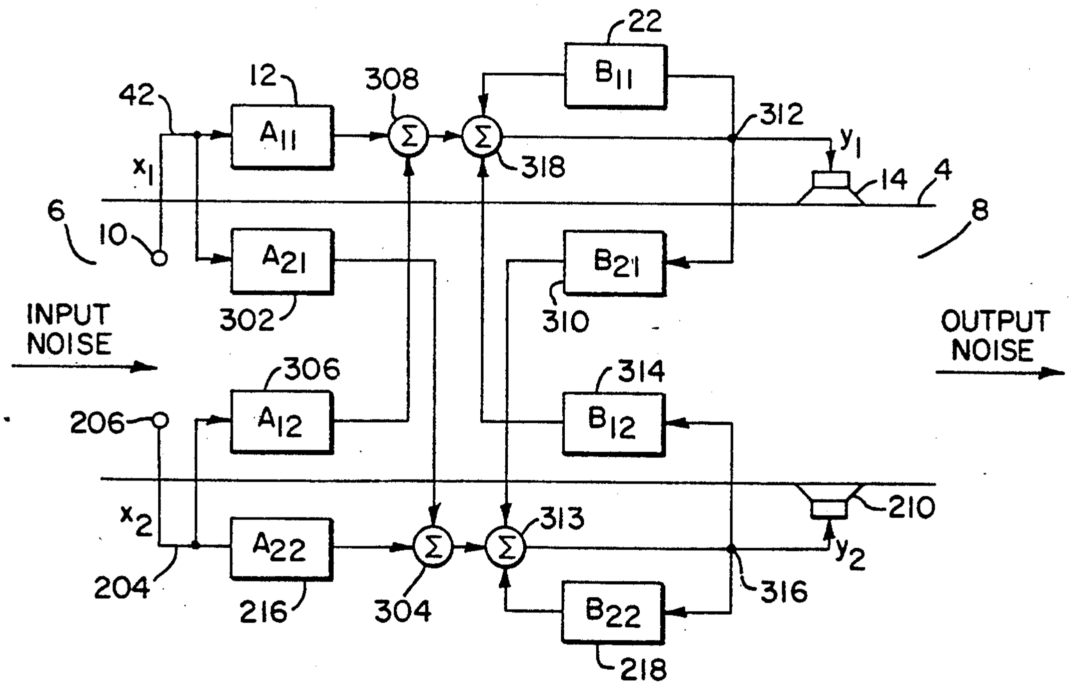

MULTI-CHANNEL ACTIVE ACOUSTIC ATTENUATION SYSTEM

BACKGROUND AND SUMMARY

The invention relates to active acoustic attenuation systems, and more particularly to a generalized multi-channel system.

The invention particularly arose during continuing development efforts relating to the subject matter shown and described in U.S. Pat. No. 4,815,139, incorporated herein by reference. The invention arose during continuing development efforts relating to the subject matter shown and described in U.S. Pat. Nos. 4,677,676, 4,677,677, 4,736,431, 4,837,834, and 4,987,598, and allowed applications Ser. No. 07/388,014, filed Jul. 31, 1989, and Ser. No. 07/464,337, filed Jan. 12, 1990, all incorporated herein by reference.

Active acoustic attenuation or noise control involves injecting a canceling acoustic wave to destructively interfere with and cancel an input acoustic wave. In an active acoustic attenuation system, the output acoustic wave is sensed with an error transducer such as a microphone which supplies an error signal to an adaptive filter control model which in turn supplies a correction signal to a canceling transducer such as a loudspeaker which injects an acoustic wave to destructively interfere with the input acoustic wave and cancel same such that the output acoustic wave or sound at the error microphone is zero or some other desired value.

The present invention provides a generalized multi-channel active acoustic attenuation system for attenuating complex sound fields in a duct, large or small, a room, a vehicle cab, or free space. The system may be used with multiple input microphones and/or multiple canceling loudspeakers and/or multiple error microphones, and includes a plurality of adaptive filter channel models, with each channel model being intraconnected to each of the remaining channel models and providing a generalized solution wherein the inputs and outputs of all channel models depend on the inputs and outputs of all other channel models.

BRIEF DESCRIPTION OF THE DRAWINGS

Prior Art

FIG. 6 shows a multi-channel active acoustic attenuation system known in the prior art.

Present Invention

FIG. 7 is a schematic illustration of a multi-channel active acoustic attenuation system in accordance with the present invention.

Figure 8:
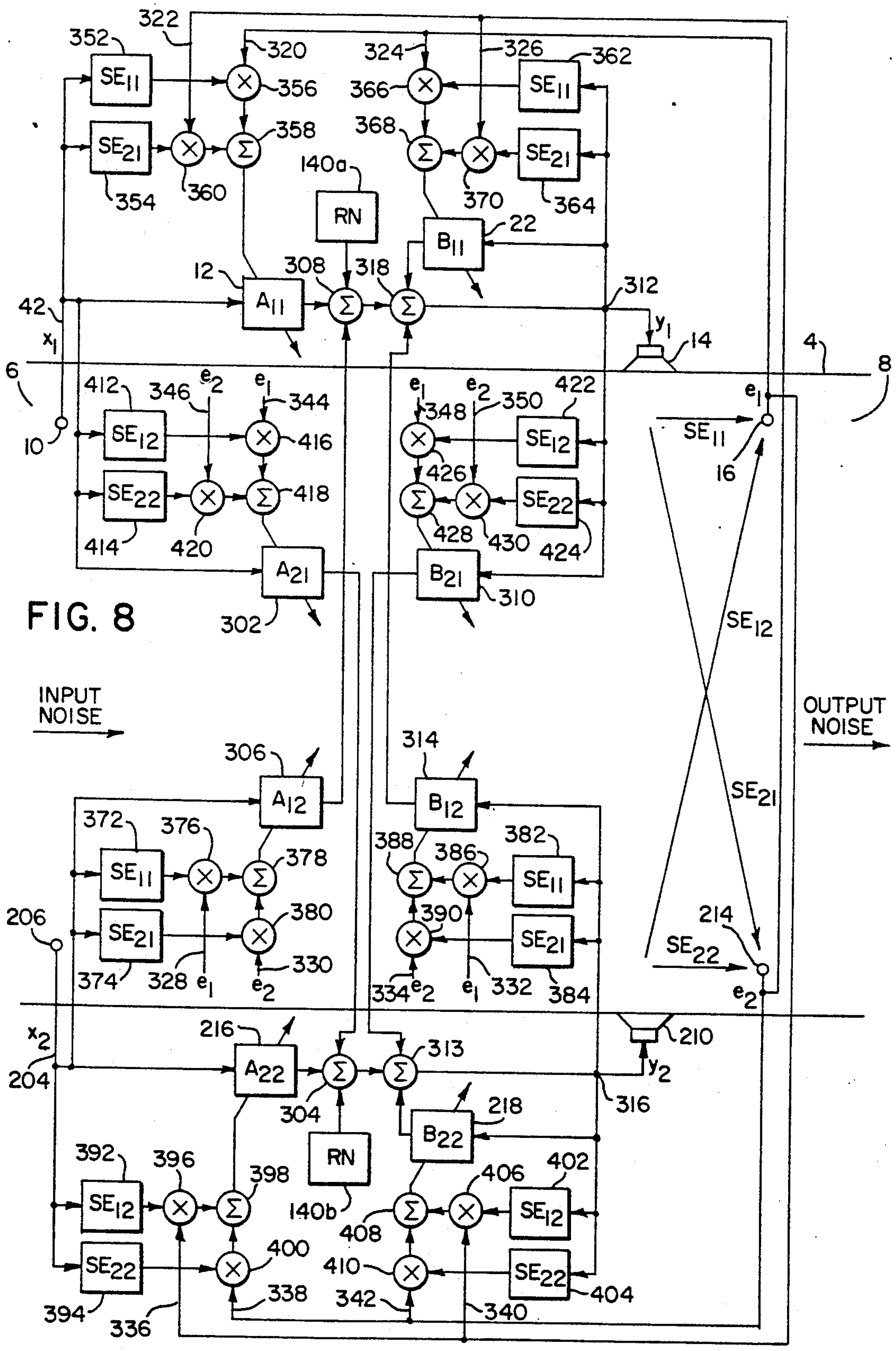

FIG. 8 shows a further embodiment of the system of FIG. 7.

Figure 9:
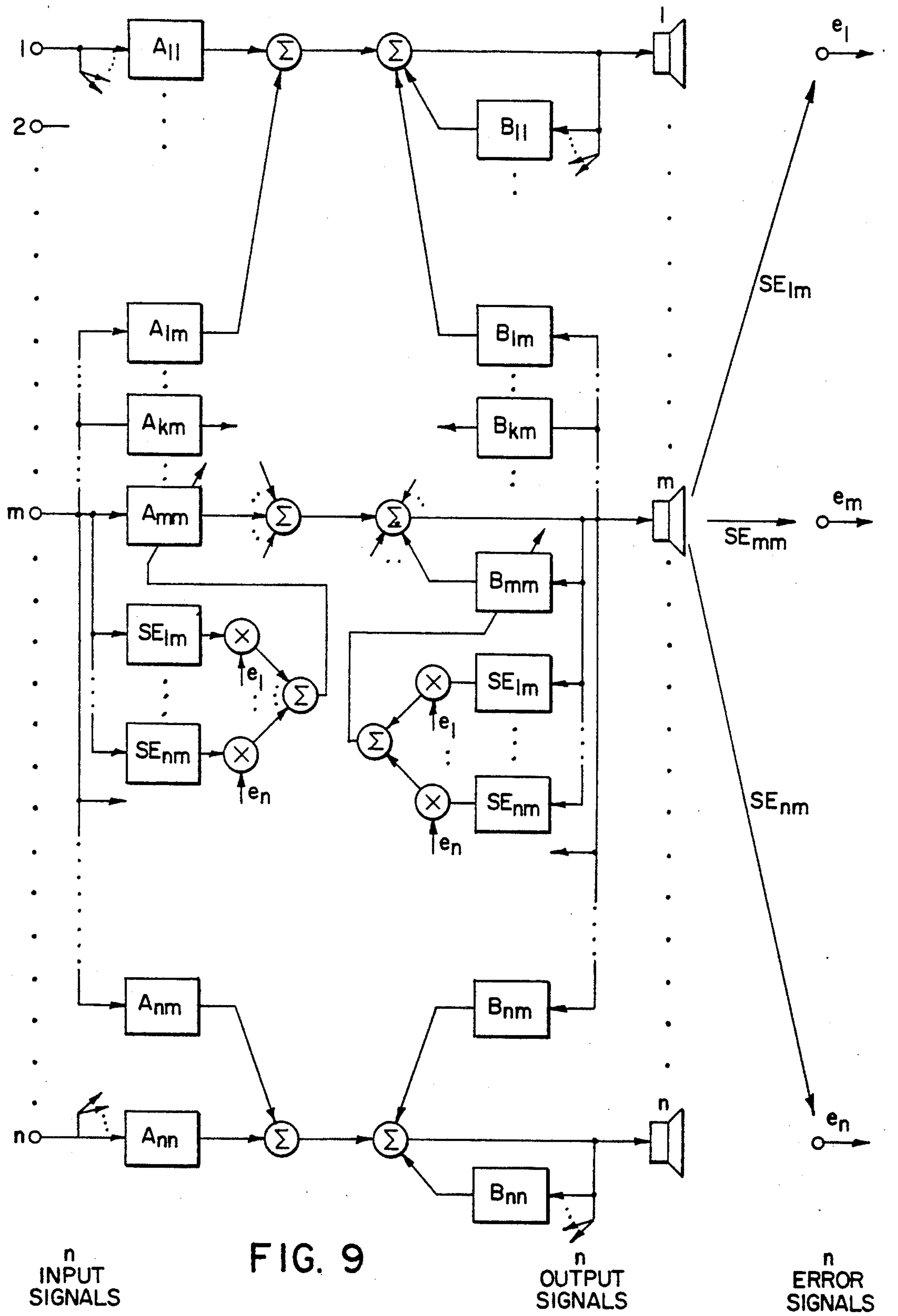

FIG. 9 shows a generalized system.

DETAILED DESCRIPTION

Prior Art

Figure 1:
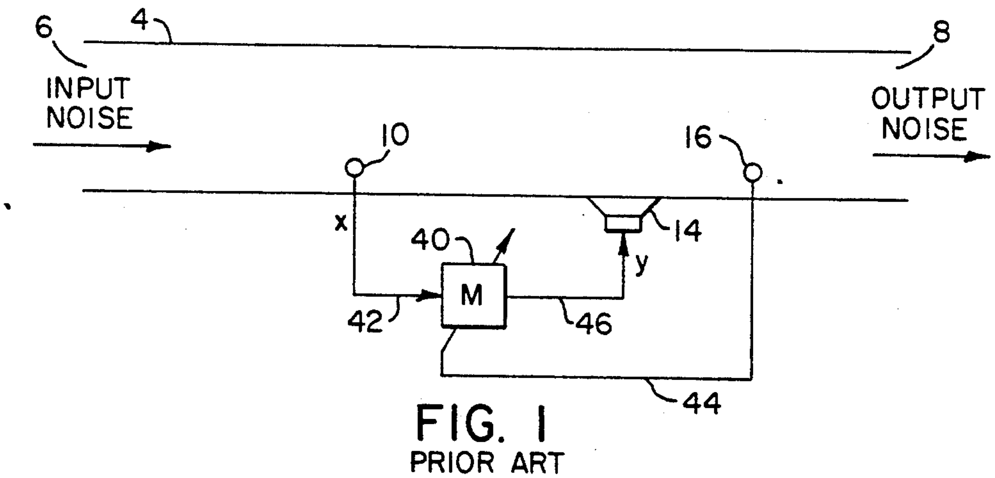
FIG. 1 PRIOR ART
FIG. 1 is a schematic illustration of an active acoustic attenuation system in accordance with above incorporated U.S. Pat. Nos. 4,677,676 and 4,677,677.

FIG. 1 shows an active acoustic attenuation system in accordance with incorporated U.S. Pat. Nos. 4,677,676 and 4,677,677, FIG. 5, and like reference numerals are used from said patents where appropriate to facilitate understanding. For further background, reference is also made to "Development of the Filtered-U Algorithm for Active Noise Control", L. J. Eriksson, Journal of Acoustic Society of America, 89(1), January, 1991, pages 257–265. The system includes a propagation path or environment such as within or defined by a duct or plant 4. The system has an input 6 for receiving an input acoustic wave, e.g., input noise, and an output 8 for radiating or outputting an output acoustic wave, e.g., output noise. An input transducer such as input microphone 10 senses the input acoustic wave. An output transducer such as canceling loudspeaker 14 introduces a canceling acoustic wave to attenuate the input acoustic wave and yield an attenuated output acoustic wave. An error transducer such as error microphone 16 senses the output acoustic wave and provides an error signal at 44. Adaptive filter model M at 40 combined with output transducer 14 adaptively models the acoustic path from input transducer 10 to output transducer 14. Model M has a model input 42 from input transducer 10, an error input 44 from error transducer 16, and a model output 46 outputting a correction signal to output transducer 14 to introduce the canceling acoustic wave. Model M provides a transfer function which when multiplied by its input x yields output y, equation 1.

$$Mx=y \quad \text{Eq. 1}$$

Figure 2:
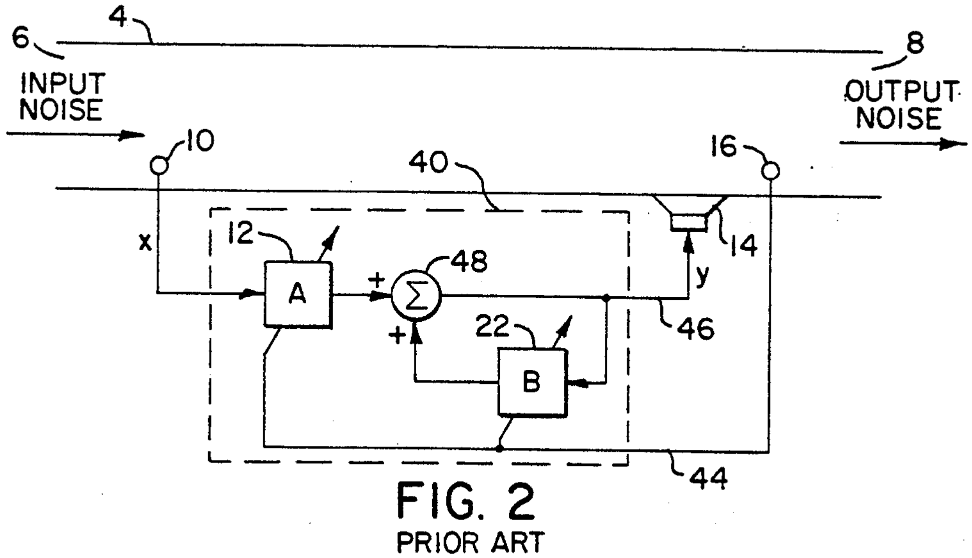
FIG. 2 PRIOR ART
FIG. 2 shows another embodiment of the system of FIG. 1.

As noted in incorporated U.S. Pat. Nos. 4,677,676 and 4,677,677, model M is an adaptive recursive filter having a transfer function with both poles and zeros. Model M is provided by a recursive least mean square, RLMS, filter having a first algorithm provided by LMS filter A at 12, FIG. 2, and a second algorithm provided by LMS filter B at 22. Adaptive model M uses filters A and B combined with output transducer 14 to adaptively model both the acoustic path from input transducer 10 to output transducer 14, and the feedback path from output transducer 14 to input transducer 10. Filter A provides a direct transfer function, and filter B provides a recursive transfer function. The outputs of filters A and B are summed at summer 48, whose output provides the correction signal on line 46. Filter 12 multiplies input signal x by transfer function A to provide the term Ax, equation 2. Filter 22 multiplies its input signal y by transfer function B to yield the term By, equation 2. Summer 48 adds the terms Ax and By to yield a resultant sum y which is the model output correction signal on line 46, equation 2.

$$Ax+By=y \quad \text{Eq. 2}$$

Solving equation 2 for y yields equation 3.

$$y=\frac{A}{1-B}x \quad \text{Eq. 3}$$

Figure 3:
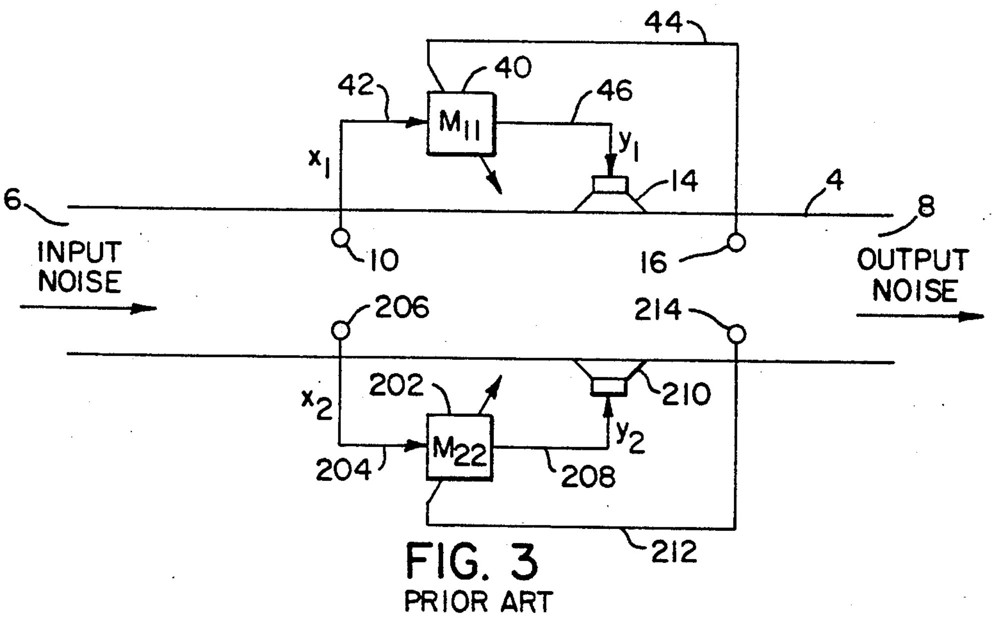
FIG. 3 PRIOR ART
FIG. 3 shows a higher order system in accordance with above incorporated U.S. Pat. No. 4,815,139.

FIG. 3 shows a plural model system including a first channel model $M_{11}$ at 40, comparably to FIG. 1, and a second channel model $M_{22}$ at 202, comparably to FIG.

7 in incorporated U.S. Pat. No. 4,815,139. Each channel model connects a given input and output transducer. Model 202 has a model input 204 from a second input transducer provided by input microphone 206, a model output 208 providing a correction signal to a second output transducer provided by canceling loudspeaker 210, and an error input 212 from a second error transducer provided by error microphone 214. It is also known to provide further models, as shown in incorporated U.S. Pat. No. 4,815,139. Multiple input transducers 10, 206, etc. may be used for providing plural input signals representing the input acoustic wave, or alternatively only a single input signal need be provided and the same such input signal may be input to each of the adaptive filter models. Further alternately, no input microphone is necessary, and instead the input signal may be provided by a transducer such as a tachometer which provides the frequency of a periodic input acoustic wave. Further alternatively, the input signal may be provided by one or more error signals, in the case of a periodic noise source, "Active Adaptive Sound Control In A Duct: A Computer Simulation", J. C. Burgess, Journal of Acoustic Society of America, 70(3), September, 1981, pages 715-726.

Figure 4:
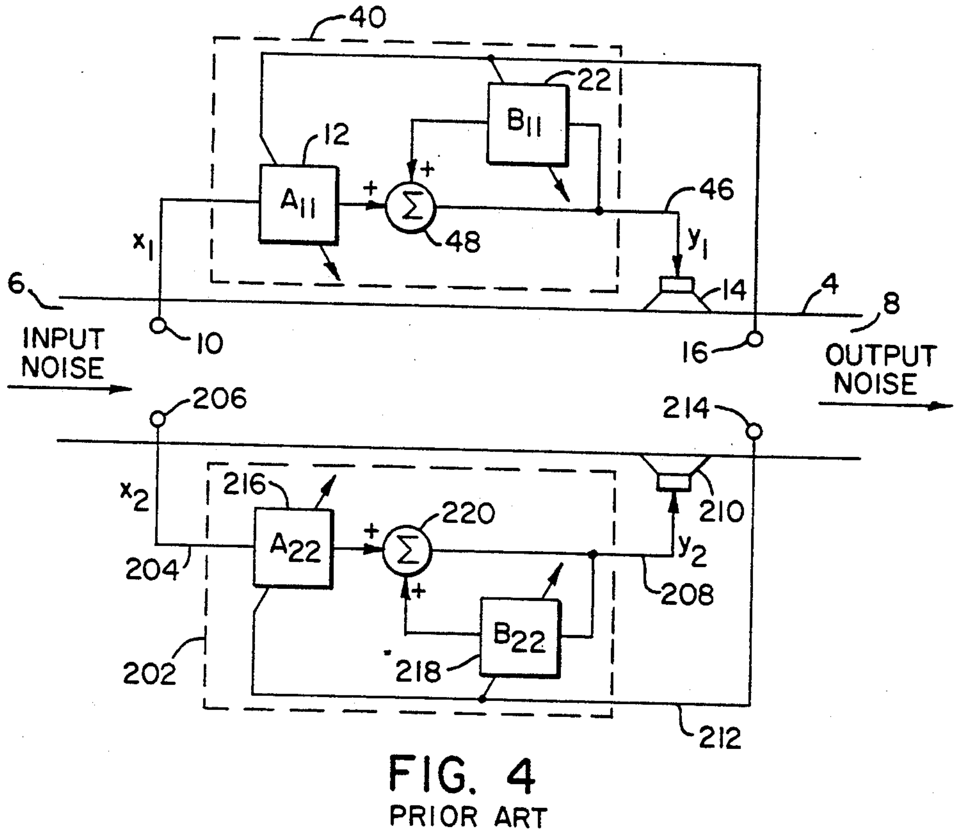
FIG. 4 PRIOR ART
FIG. 4 shows a further embodiment of the system of FIG. 3.

In FIG. 4, each of the models of FIG. 3 is provided by an RLMS adaptive filter model. Model $M_{11}$ includes LMS filter $A_{11}$ at 12 providing a direct transfer function, and LMS filter $B_{11}$ at 22 providing a recursive transfer function The outputs of filters $A_{11}$ and $B_{11}$ are summed at summer 48 having an output providing the correction signal at 46. Model $M_{22}$ includes LMS filter $A_{22}$ at 216 providing a direct transfer function, and LMS filter $B_{22}$ at 218 providing a recursive transfer function. The outputs of filters $A_{22}$ and $B_{22}$ are summed at summer 220 having an output providing the correction signal at 208. Applying equation 3 to the system in FIG. 4 yields equation 4 for $y_1$, and equation 5 for $y_2$.

$$y_1 = \frac{A_1}{1 - B_1} x_1 \quad \text{Eq. 4}$$

$$y_2 = \frac{A_2}{1 - B_2} x_2 \quad \text{Eq. 5}$$

Figure 5:
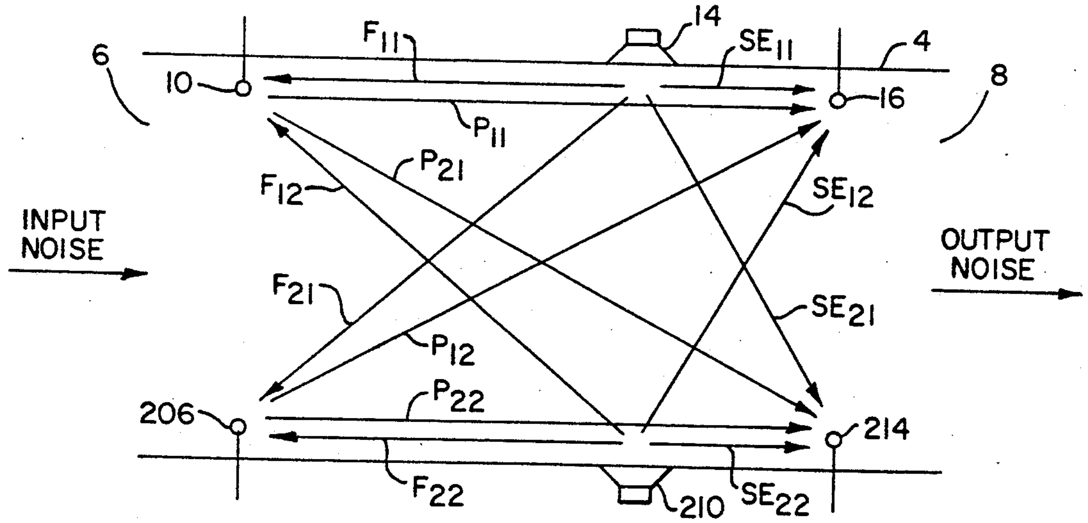
FIG. 5 PRIOR ART
FIG. 5 shows cross-coupled paths in the system of FIG. 4.

FIG. 5 shows cross-coupling of acoustic paths of the system in FIG. 4, including: acoustic path $Pe_{11}$ to the first error transducer 16 from the first input transducer 10; acoustic path $P_{21}$ to the second error transducer 214 from the first input transducer 10; acoustic path $P_{12}$ to the first error transducer 16 from the second input transducer 206; acoustic path $P_{22}$ to the second error transducer 214 from the second input transducer 206; feedback acoustic path $F_{11}$ to the first input transducer 10 from the first output transducer 14; feedback acoustic path $F_{21}$ to the second input transducer 206 from the first output transducer 14; feedback acoustic path $F_{12}$ to the first input transducer 10 from the second output transducer 210; feedback acoustic path $F_{22}$ to the second input transducer 206 from the second output transducer 210; acoustic path $SE_{11}$ to the first error transducer 16 from the first output transducer 14; acoustic path $SE_{21}$ to the second error transducer 214 from the first output transducer 14; acoustic path $SE_{12}$ to the first error transducer 16 from the second output transducer 210; and acoustic path $SE_{22}$ to the second error transducer 214 from the second output transducer 210.

FIG. 6 is like FIG. 4 and includes additional RLMS adaptive filters for modeling designated cross-coupled paths, for which further reference may be had to "An Adaptive Algorithm For IIR Filters Used In Multichannel Active Sound Control Systems", Elliott et al, Institute of Sound and Vibration Research Memo No. 681, University of Southampton, February 1988. The Elliott et al reference extends the multi-channel system of noted U.S. Pat. No. 4,815,139 by adding further models of cross-coupled paths between channels, and summing the outputs of the models. LMS filter $A_{21}$ at 222 and LMS filter $B_{21}$ at 224 are summed at summer 226, and the combination provides an RLMS filter modeling acoustic path $P_{21}$ and having a model output providing a correction signal at 228 summed at summer 230 with the correction signal from model output 208. LMS filter $A_{12}$ at 232 and LMS filter $B_{12}$ at 234 are summed at summer 236, and the combination provides an RLMS filter modeling acoustic path $P_{12}$ and having a model output at 238 providing a correction signal which is summed at summer 240 with the correction signal from model output 46. Applying equation 3 to the RLMS algorithm filter provided by $A_{11}$, $B_{11}$, FIG. 6, and to the RLMS algorithm filter provided by $A_{12}$, $B_{12}$, yields equation 6.

$$y_1 = \frac{A_{11}}{1 - B_{11}} x_1 + \frac{A_{12}}{1 - B_{12}} x_2 \quad \text{Eq. 6}$$

Rearranging equation 6 yields equation 7.

$$y_1 = \frac{A_{11}x_1 - B_{12}A_{11}x_1 + A_{12}x_2 - B_{11}A_{12}x_2}{(1 - B_{11})(1 - B_{12})} \quad \text{Eq. 7}$$

Applying equation 3 to the RLMS algorithm filter provided by $A_{21}$, $B_{21}$, FIG. 6, and to the RLMS algorithm filter provided by $A_{22}$, $B_{22}$, yields equation 8.

$$y_2 = \frac{A_{21}}{1 - B_{21}} x_1 + \frac{A_{22}}{1 - B_{22}} x_2 \quad \text{Eq. 8}$$

Rearranging equation 8 yields equation 9.

$$y_2 = \frac{A_{21}x_1 - B_{22}A_{21}x_1 + A_{22}x_2 - B_{21}A_{22}x_2}{(1 - B_{21})(1 - B_{22})} \quad \text{Eq. 9}$$

PRESENT INVENTION

FIG. 7 is a schematic illustration like FIGS. 4 and 6, but showing the present invention. LMS filter $A_{21}$ at 302 has an input at 42 from first input transducer 10, and an output summed at summer 304 with the output of LMS filter $A_{22}$. LMS filter $A_{12}$ at 306 has an input at 204 from second input transducer 206, and an output summed at summer 308 with the output of LMS filter $A_{11}$. LMS filter $B_{21}$ at 310 has an input from model output 312, and an output summed at summer 313 with the summed outputs of $A_{21}$ and $A_{22}$ and with the output of LMS filter $B_{22}$. Summers 304 and 313 may be common or separate. LMS filter $B_{12}$ at 314 has an input from model output 316, and has an output summed at summer 318 with the summed outputs of $A_{11}$ and $A_{12}$ and the output of LMS filter $B_{11}$. Summers 308 and 318 may be separate or common. FIG. 7 shows a two channel system with a first channel model provided by RLMS filter $A_{11}$, $B_{11}$, and a second channel model provided by RLMS filter $A_{22}$, $B_{22}$, intraconnected with each other and accounting for cross-coupled terms not compensated in the prior art, to be described.

In FIG. 7, the models are intraconnected with each other, to be more fully described, in contrast to FIG. 6 where the models are merely summed. For example, in FIG. 6, model $A_{11}$, $B_{11}$ is summed with model $A_{12}$, $B_{12}$ at summer 240, and model $A_{22}$, $B_{22}$ is summed with model $A_{21}$, $B_{21}$ at summer 230. Summing alone of additional cross-path models, as at 230 and 240 in FIG. 6, does not fully compensate cross-coupling, because the acoustic feedback paths, FIG. 5, each receive a signal from an output transducer that is excited by the outputs of at least two models. In order to properly compensate for such feedback, the total output signal must be used as the input to the recursive model element. In FIG. 6, the signal to each output transducer 14, 210, is composed of the sum of the outputs of several models. However, only the output of each separate model is used as the input to the recursive element for that model, for example $B_{11}$ at 22 receives only the output 46 of the model $A_{11}$, $B_{11}$, even though the output transducer 14 excites feedback path $F_{11}$ using not only the output 46 of model $A_{11}$, $B_{11}$, but also the output 238 of model $A_{12}$, $B_{12}$. The present invention addresses and remedies this lack of compensation, and provides a generalized solution for complex sound fields by using intraconnected models providing two or more channels wherein the inputs and outputs of all models depend on the inputs and outputs of all other models.

The invention provides a multi-channel active acoustic attenuation system for attenuating complex input acoustic waves and sound fields. FIG. 7 shows a two channel system with a first channel model $A_{11}$, $B_{11}$, and a second channel model $A_{22}$, $B_{22}$. Additional channels and models may be added. Each of the channel models is intraconnected to each of the remaining channel models. Each channel model has a model input from each of the remaining channel models. The first channel model has an input through transfer function $B_{12}$ at 314 from the output 316 of the second channel model, and has a model input through transfer function $A_{12}$ at 306 from input transducer 206. The second channel model has a model input through transfer function $B_{21}$ at 310 from the output 312 of the first channel model, and has a model input through transfer function $A_{21}$ at 302 from input transducer 10. The correction signal from each channel model output to the respective output transducer is also input to each of the remaining channel models. The input signal to each channel model from the respective input transducer is also input to each of the remaining channel models. The summation of these inputs and outputs, for example at summers 308, 318 in the first channel model, 304, 313 in the second channel model, etc., results in intraconnected channel models.

The correction signal at model output 312 in FIG. 7 applied to output transducer 14 is the same signal applied to the respective recursive transfer function $B_{11}$ at 22 of the first channel model. This is in contrast to FIG. 6 where the correction signal $y_1$ applied to output transducer 14 is not the same signal applied to recursive transfer function $B_{11}$. The correction signal $y_2$ at model output 316 in FIG. 7 applied to output transducer 210 is the same signal applied to recursive transfer function $B_{22}$. In contrast, in FIG. 6 correction signal $y_2$ applied to output transducer 210 is not the same signal applied to recursive transfer function $B_{22}$. Correction signal $y_1$ in FIG. 7 from model output 312 of the first channel model is also applied to recursive transfer function $B_{21}$ of the second channel model, again in contrast to FIG. 6. Likewise, correction signal $y_2$ in FIG. 7 from model output 316 of the second channel model is applied to recursive transfer function $B_{12}$ of the first channel model, again in contrast to FIG. 6.

In FIG. 7, the first channel model has direct transfer functions $A_{11}$ at 12 and $A_{12}$ at 306 having outputs summed with each other at summer 308. The first channel model has a plurality of recursive transfer functions $B_{11}$ at 22 and $B_{12}$ at 314 having outputs summed with each other at summer 318 and summed with the summed outputs of the direct transfer functions from summer 308 to yield a resultant sum at model output 312 which is the correction signal $y_1$. The second channel model has direct transfer functions $A_{22}$ at 216 and $A_{21}$ at 302 having outputs summed with each other at summer 304. The second channel model has a plurality of recursive transfer functions $B_{22}$ at 218 and $B_{21}$ at 310 having outputs summed with each other at summer 313 and summed with the summed outputs of the direct transfer functions from summer 304 to yield a resultant sum at model output 316 which is the correction signal $y_2$. Each noted resultant sum $y_1$, $y_2$, etc., is input to one of the recursive transfer functions of its respective model and is also input to one of the recursive functions of each remaining model.

Applying equation 2 to the system in FIG. 7 for $y_1$ provides product of the transfer function $A_{11}$ times input signal $x_1$ summed at summer 308 with the product of the transfer function $A_{12}$ times the input signal $x_2$ and further summed at summer 318 with the product of the transfer function $B_{11}$ times model output correction signal $y_1$ summed at summer 318 with the product of the transfer function $B_{12}$ times the model output correction signal $y_2$, to yield $y_1$, equation 10.

$$A_{11}x_1+A_{12}x_2+B_{11}y_1+B_{12}y_2=y_1 \qquad \text{Eq. 10}$$

Further applying equation 2 to the system in FIG. 7 for $y_2$ provides the product of the transfer function $A_{22}$ times input signal $x_2$ summed at summer 304 with the product of the transfer function $A_{21}$ times input signal $x_1$ and further summed at summer 313 with the product of the transfer function $B_{22}$ times model output correction signal $y_2$ summed at summer 313 with the product of transfer function $B_{21}$ times the model output correction signal $y_1$, to yield $y_2$, equation 11.

$$A_{22}x_2+A_{21}x_1+B_{22}y_2+B_{21}y_1=y_2 \qquad \text{Eq. 11}$$

Solving equation 10 for $y_1$ yields equation 12.

$$y_1=\frac{A_{11}x_1+A_{12}x_2+B_{12}y_2}{1-B_{11}} \qquad \text{Eq. 12}$$

Solving equation 11 for $y_2$ yields equation 13.

$$y_2=\frac{A_{22}x_2+A_{21}x_1+B_{21}y_1}{1-B_{22}} \qquad \text{Eq. 13}$$

Substituting equation 13 into equation 12 yields equation 14.

$$y_1 = \frac{A_{11}x_1 + A_{12}x_2 + B_{12}\left(\frac{A_{22}x_2 + A_{21}x_1 + B_{21}y_1}{1 - B_{22}}\right)}{1 - B_{11}} \quad \text{Eq. 14}$$

Rearranging equation 14 yields equation 15.

$$y_1 = \frac{A_{11}x_1 - B_{22}A_{11}x_1 + A_{12}x_2 - B_{22}A_{12}x_2 + B_{12}A_{22}x_2 + B_{12}A_{21}x_1 + B_{12}B_{21}y_1}{(1 - B_{11})(1 - B_{22})} \quad \text{Eq. 15}$$

Solving equation 15 for $y_1$ yields equation 16.

$$y_1 = \frac{A_{11}x_1 - B_{22}A_{11}x_1 + A_{12}x_2 - B_{22}A_{12}x_2 + B_{12}A_{22}x_2 + B_{12}A_{21}x_1}{(1 - B_{11})(1 - B_{22}) - B_{12}B_{21}} \quad \text{Eq. 16}$$

Contrasting the numerators in equations 16 and 7, it is seen that the present system compensates numerous cross-coupled terms not compensated in the prior art. The compensation of the additional cross-coupled terms provides better convergence and enhanced stability.

Substituting equation 12 into equation 13 yields equation 17.

$$y_2 = \frac{A_{22}x_2 + A_{21}x_1 + B_{21}\left(\frac{A_{11}x_1 + A_{12}x_2 + B_{12}y_2}{1 - B_{11}}\right)}{1 - B_{22}} \quad \text{Eq. 17}$$

Rearranging equation 17 yields equation 18.

$$y_2 = \frac{A_{22}x_2 - B_{11}A_{22}x_2 + A_{21}x_1 - B_{11}A_{21}x_1 + B_{21}A_{11}x_1 + B_{21}A_{12}x_2 + B_{21}B_{12}y_2}{(1 - B_{22})(1 - B_{11})} \quad \text{Eq. 18}$$

Solving equation 18 for $y_2$ yields equation 19.

$$y_2 = \frac{A_{22}x_2 - B_{11}A_{22}x_2 + A_{21}x_1 - B_{11}A_{21}x_1 + B_{21}A_{11}x_1 + B_{21}A_{12}x_2}{(1 - B_{22})(1 - B_{11}) - B_{21}B_{12}} \quad \text{Eq. 19}$$

Comparing equations 19 and 9, it is seen that the present system compensates numerous cross-coupled terms not compensated in the prior art. The compensation of the additional cross-coupled terms provides better convergence and enhanced stability.

Each channel model has an error input from each of the error transducers 16, 214, etc., FIG. 8. The system includes the above noted plurality of error paths, including a first set of error paths $SE_{11}$ and $SE_{21}$ between first output transducer 14 and each of error transducers 16 and 214, a second set of error paths $SE_{12}$ and $SE_{22}$ between second output transducer 210 and each of error transducers 16 and 214, and so on. Each channel model is updated for each error path of a given set from a given output transducer, to be described.

Each channel model has a first set of one or more model inputs from respective input transducers, and a second set of model inputs from remaining model outputs of the remaining channel models. For example, first channel model $A_{11}$, $B_{11}$ has a first set of model inputs $A_{11}x_1$ and $A_{12}x_2$ summed at summer 308. First channel model $A_{11}$, $B_{11}$ has a second set of model inputs $B_{11}y_1$ and $B_{12}y_2$ summed at summer 318. Second channel model $A_{22}$, $B_{22}$ has a first set of model inputs $A_{22}x_2$ and $A_{21}x_1$ summed at summer 304. Second channel model $A_{22}$, $B_{22}$ has a second set of model inputs $B_{22}y_2$ and $B_{21}y_1$ summed at summer 313. Each channel model has first and second algorithm means, A and B, respectively, providing respective direct and recursive transfer functions and each having an error input from each of the error transducers. The first channel model thus has a first algorithm filter $A_{11}$ at 12 having an input from input transducer 10, a plurality of error inputs 320, 322, FIG. 8, one for each of the error transducers 16, 214 and receiving respective error signals $e_1$, $e_2$ therefrom, and an output supplied to summer 308. The first channel model includes a second algorithm filter $B_{11}$ at 22 having an input from correction signal $y_1$ from output 312 of the first channel model to the first output transducer 14, a plurality of error inputs 324, 326, one for each of the error transducers 16, 214 and receiving respective error signals $e_1$, $e_2$ therefrom, and an output supplied to summer 318. Summers 308 and 318 may be separate or joint and receive the outputs of algorithm filters $A_{11}$ and $B_{11}$, and have an output providing correction signal $y_1$ from model output 312 to the first output transducer 14. The first channel model has a third algorithm filter $A_{12}$ at 306 having an input from the second input transducer 206, a plurality of error inputs 328, 330, one for each of the error transducers 16, 214 and receiving respective error signals $e_1$, $e_2$ therefrom, and an output summed at summer 308. The first channel model has a fourth algorithm filter $B_{12}$ at 314 having an input from correction signal $y_2$ from output 316 of the second channel model to the second output transducer 210, a plurality of error inputs 332, 334, one for each of the error transducers 16, 214 and receiving respective error signals $e_1$, $e_2$ therefrom, and an output summed at summer 318.

The second channel model has a first algorithm filter $A_{22}$ at 216 having an input from the second input transducer 206, a plurality of error inputs 336, 338, one for each of the error transducers 16, 214 and receiving respective error signals $e_1$, $e_2$ therefrom, and an output supplied to summer 304. The second channel model has a second algorithm filter $B_{22}$ at 218 having an input from correction signal $y_2$ from output 316 of the second channel model to the second output transducer 210, a plurality of error inputs 340, 342, one for each of the error transducers 16, 214 and receiving respective error signals $e_1$, $e_2$ therefrom, and an output supplied to summer 313. Summers 304 and 313 may be joint or separate and have inputs from the outputs of the algorithm filters 216 and 218, and an output providing correction signal $y_2$ from output 316 of the second channel model to the second output transducer 210. The second channel model includes a third algorithm filter $A_{21}$ at 302 having an input from the first input transducer 10, a plurality of error inputs 344, 346, one for each of the error transducers 16, 214 and receiving respective error signals $e_1$, $e_2$ therefrom, and an output summed at summer 304. The second channel model includes a fourth algorithm filter $B_{21}$ at 310 having an input from correction signal $y_1$ from output 312 of the first channel model to the first output transducer 14, a plurality of error inputs 348, 350, one for each of the error transducers 16, 214 and receiving respective error signals $e_1$, $e_2$ therefrom, and an output summed at summer 313. There are numerous manners of updating the weights of the filters. The preferred manner is that shown in incorporated U.S. Pat. No. 4,677,676, to be described.

Algorithm filter $A_{11}$ at 12 of the first channel model includes a set of error path models 352, 354 of respective error paths $SE_{11}$, $SE_{21}$, which are the error paths between first output transducer 14 and each of error transducers 16 and 214. The error path models are preferably provided using a random noise source as shown at 140 in FIG. 19 of incorporated U.S. Pat. No. 4,677,676, with a copy of the respective error path model provided at 352, 354, etc., as in incorporated U.S. Pat. No. 4,677,676 at 144 in FIG. 19, and for which further reference may be had to the above noted Eriksson article "Development of The Filtered-U Algorithm For Active Noise Control". Each channel model for each output transducer 14, 210 has its own random noise source 140*a*, 140*b*. Alternatively, the error path may be modeled without a random noise source as in incorporated U.S. Pat. No. 4,987,598. It is preferred that the error path modeling include modeling of both the transfer function of speaker 14 and the acoustic path from such speaker to the error microphones, though the SE model may include only one of such transfer functions, for example if the other transfer function is relatively constant. Error path model 352 has an input from input signal $x_1$ from first input transducer 10, and an output multiplied at multiplier 356 with error signal $e_1$ from the first error transducer 16 to provide a resultant product which is summed at summing junction 358. Error path model 354 has an input from first input transducer 10, and an output multiplied at multiplier 360 with error signal $e_2$ from the second error transducer 214 to provide a resultant product which is summed at summing junction 358. The output of summing junction 358 provides a weight update to algorithm filter $A_{11}$ at 12.

The second algorithm filter $B_{11}$ at 22 of the first channel model includes a set of error path models 362, 364 of respective error paths $SE_{11}$, $SE_{21}$ between first output transducer 16 and each of error transducers 16, 214. Error path model 362 has an input from correction signal $y_1$ from output 312 of the first channel model applied to first output transducer 14. Error path model 362 has an output multiplied at multiplier 366 with error signal $e_1$ from first error transducer 16 to provide a resultant product which is summed at summing junction 368. Error path model 364 has an input from correction signal $y_1$ from output 312 of the first channel model applied to the first output transducer 14. Error path model 364 has an output multiplied at multiplier 370 with error signal $e_2$ from second error transducer 214 to provide a resultant product which is summed at summing junction 368. The output of summing junction 368 provides a weight update to algorithm filter $B_{11}$ at 22.

The third algorithm filter $A_{12}$ at 306 of the first channel model includes a set of error path models 372, 374 of respective error paths $SE_{11}$, $SE_{21}$ between first output transducer 14 and each of error transducers 16, 214. Error path model 372 has an input from input signal $x_2$ from second input transducer 206, and an output multiplied at multiplier 376 with error signal $e_1$ from first error transducer 16 to provide a resultant product which is summed at summing junction 378. Error path model 374 has an input from input signal $x_2$ from first input transducer 206, and an output multiplied at multiplier 380 with error signal $e_2$ from second error transducer 214 to provide a resultant product which is summed at summing junction 378. The output of summing junction 378 provides a weight update to algorithm filter $A_{12}$ at 306.

The fourth algorithm filter $B_{12}$ at 314 of the first channel model includes a set of error path models 382, 384 of respective error paths $SE_{11}$, $SE_{21}$ between first output transducer 14 and each of error transducers 16, 214. Error path model 382 has an input from correction signal $y_2$ from output 316 of the second channel model applied to second output transducer 210. Error path model 382 has an output multiplied at multiplier 386 with error signal $e_1$ from first error transducer 16 to provide a resultant product which is summed at summing junction 388. Error path model 384 has an input from correction signal $y_2$ from output 316 of the second channel model applied to the second output transducer 210. Error path model 384 has an output multiplied at multiplier 390 with error signal $e_2$ from second error transducer 214 to provide a resultant product which is summed at summing junction 388. The output of summing junction 388 provides a weight update to algorithm filter $B_{12}$ at 314.

The first algorithm filter $A_{22}$ at 216 of the second channel model includes a set of error path models 392, 394 of respective error paths $SE_{12}$, $SE_{22}$ between second output transducer 210 and each of error transducers 16, 214. Error path model 392 has an input from input signal $x_2$ from second input transducer 206, and an output multiplied at multiplier 396 with error signal $e_1$ from first error transducer 16 to provide a resultant product which is summed at summing junction 398. Error path model 394 has an input from input signal $x_2$ from second input transducer 206, and an output multiplied at multiplier 400 with error signal $e_2$ from second error transducer 214 to provide a resultant product which is summed at summing junction 398. The output of summing junction 398 provides a weight update to algorithm filter $A_{22}$ at 216.

The second algorithm filter $B_{22}$ at 218 of the second channel model includes a set of error path models 402, 404 of respective error paths $SE_{12}$, $SE_{22}$ between second output transducer 210 and each of error transducers 16, 214. Error path model 402 has an input from correction signal $y_2$ from output 316 of the second channel model applied to the second output transducer 210. Error path model 402 has an output multiplied at multiplier 406 with error signal $e_1$ from first error transducer 16 to provide a resultant product which is summed at summing junction 408. Error path model 404 has an input from correction signal $y_2$ from output 316 of the second channel model applied to the second output transducer 210. Error path model 404 has an output multiplied with error signal $e_2$ at multiplier 410 to provide a resultant product which is summed at summing junction 408. The output of summing junction 408 provides a weight update to algorithm filter $B_{22}$ at 218.

The third algorithm filter $A_{21}$ at 302 of the second channel model includes a set of error path models 412, 414 of respective error paths $SE_{12}$, $SE_{22}$ between second output transducer 210 and each of error transducers 16, 214. Error path model 412 has an input from input signal $x_1$ from first input transducer 10, and an output multiplied at multiplier 416 with error signal $e_1$ to provide a resultant product which is summed at summing junction 418. Error path model 414 has an input from input signal $x_1$ from first input transducer 10, and an output multiplied at multiplier 420 with error signal $e_2$ from second error transducer 214 to provide a resultant product which is summed at summing junction 418. The output of summing junction 418 provides a weight update to algorithm filter $A_{21}$ at 302.

The fourth algorithm filter $B_{21}$ at 310 of the second channel model includes a set of error path models 422, 424 of respective error paths $SE_{12}$, $SE_{22}$ between second output transducer 210 and each of error transducers 16, 214. Error path model 422 has an input from correction signal $y_1$ from output 312 of the first channel model applied to the first output transducer 14. Error path model 422 has an output multiplied at multiplier 426 with error signal $e_1$ from first error transducer 16 to provide a resultant product which is summed at summing junction 428. Error path model 424 has an input from correction signal $y_1$ from output 312 of the first channel model applied to the first output transducer 14. Error path model 424 has an output multiplied at multiplier 430 with error signal $e_2$ from the second error transducer 214 to provide a resultant product which is summed at summing junction 428. The output of summing junction 428 provides a weight update to algorithm filter $B_{21}$ at 310.

The invention is not limited to a two channel system, but rather may be expanded to any number of channels. FIG. 9 shows the generalized system for n input signals from n input transducers, n output signals to n output transducers, and n error signals from n error transducers, by extrapolating the above two channel system. FIG. 9 shows the $m^{th}$ input signal from the $m^{th}$ input transducer providing an input to algorithm filter $A_{lm}$ through $A_{km}$ through $A_{mm}$ through $A_{nm}$. Algorithm filter $A_{mm}$ is updated by the weight update from the sum of the outputs of respective error path models $SE_{lm}$ through $SE_{nm}$ multiplied by respective error signals $e_l$ through $e_n$. Algorithm filter $A_{km}$ is updated by the weight update from the sum of the outputs of respective error path models $SE_{lk}$ through $SE_{nk}$ multiplied by respective error signals $e_l$ through $e_n$. The model output correction signal to the $m^{th}$ output transducer is applied to filter model $B_{lm}$, which is the recursive transfer function in the first channel model from the $m^{th}$ output transducer, and so on through $B_{km}$ through $B_{mm}$ through $B_{nm}$. Algorithm filter $B_{mm}$ is updated by the weight update from the sum of the outputs of respective SE error path models $SE_{lm}$ through $SE_{nm}$ multiplied by respective error signals $e_l$ through $e_n$. Algorithm filter $B_{km}$ is updated by the weight update from the sum of the outputs of respective error path models $SE_{lk}$ through $SE_{nk}$ multiplied by respective error signals $e_l$ through $e_n$. The system provides a multichannel generalized active acoustic attenuation system for complex sound fields. Each of the multiple channel models is intraconnected with all other channel models. The inputs and outputs of all channel models depend on the inputs and outputs of all other channel models. The total signal to the output transducers is used as an input to all other channel models. All error signals, e.g., $e_l$ . . . $e_n$, are used to update each channel.

It is preferred that each channel has its own input transducer, output transducer, and error transducer, though other combinations are possible. For example, a first channel may be the path from a first input transducer to a first output transducer, and a second channel may be the path from the first input transducer to a second output transducer. Each channel has a channel model, and each channel model is intraconnected with each of the remaining channel models, as above described. The system is applicable to one or more input transducers, one or more output transducers, and one or more error transducers, and at a minimum includes at least two input signals or at least two output transducers. One or more input signals representing the input acoustic wave providing the input noise at 6 are provided by input transducers 10, 206, etc., to the adaptive filter models. Only a single input signal need be provided, and the same such input signal may be input to each of the adaptive filter models. Such single input signal may be provided by a single input microphone, or alternatively the input signal may be provided by a transducer such as a tachometer which provides the frequency of a periodic input acoustic wave such as from an engine or the like. Further alternatively, the input signal may be provided by one or more error signals, as above noted, in the case of a periodic noise source, "Active Adaptive Sound Control In A Duct: A Computer Simulation", J. C. Burgess, Journal of Acoustic Society of America, 70(3), September 1981, pages 715-726. The system includes a propagation path or environment such as within or defined by a duct or plant 4, though the environment is not limited thereto and may be a room, a vehicle cab, free space, etc. The system has other applications such as vibration control in structures or machines, wherein the input and error transducers are accelerometers for sensing the respective acoustic waves, and the output transducers are shakers for outputting canceling acoustic waves. An exemplary application is active engine mounts in an automobile or truck for damping engine vibration. The invention is also applicable to complex structures for controlling vibration. In general, the system may be used for attenuation of an undesired elastic wave in an elastic medium, i.e. an acoustic wave propagating in an acoustic medium.

It is recognized that various equivalents, alternatives and modifications are possible within the scope of the appended claims.

I claim:

1. A multi-channel active acoustic attenuation system for attenuating an input acoustic wave, comprising:

at least one output transducer introducing at least one respective canceling acoustic wave to attenuate said input acoustic wave and yield an attenuated output acoustic wave;

at least one error transducer sensing said output acoustic wave and providing at least one respective error signal;

a plurality of adaptive filter channel models, each having at least one error input from a respective error transducer and having a model output outputting a correction signal to a respective output transducer to introduce the respective canceling acoustic wave, wherein at least one of said channel models has a model input from at least one of the remaining channel models.

2. A multi-channel active acoustic attenuation system for attenuating an input acoustic wave, comprising:

at least one output transducer introducing at least one respective canceling acoustic wave to attenuate said input acoustic wave and yield an attenuated output acoustic wave;

at least one error transducer sensing said output acoustic wave and providing at least one respective error signal;

a plurality of adaptive filter channel models, each having at least one error input from a respective error transducer and having a model output outputting a correction signal to a respective output transducer to introduce the respective canceling acoustic wave, wherein said correction signal from said model output to the respective output transducer is also input to at least one of the remaining channel models.

3. The system according to claim 2 wherein each said channel model has a model input from each of the remaining channel models.

4. The system according to claim 2 wherein said correction signal from each said model output to the respective output transducer is also input to each of the remaining channel models.

5. The system according to claim 2 wherein each said channel model has an error input from each error transducer.

6. The system according to claim 2 comprising a plurality of error paths, including a first set of error paths between a first output transducer and each error transducer, and a second set of error paths between a second output transducer and each error transducer, and wherein each channel model is updated for each error path of a given set from a given output transducer.

7. The system according to claim 2 wherein said plurality of adaptive filter channel models is provided by first and second channel models, said first channel model having a model input from said second channel model, said second channel model having a model input from said first channel model, said correction signal from said first model output to the respective output transducer also being input to said second channel model, said correction signal from said second model output to the respective output transducer also being input to said first channel model.

8. A multi-channel active acoustic attenuation system for attenuating an input acoustic wave, comprising:

at least one output transducer introducing at least one respective canceling acoustic wave to attenuate said input acoustic wave and yield an attenuated output acoustic wave;

at least one error transducer sensing said output acoustic wave and providing at least one respective error signal;

a plurality of adaptive filter channel models, each having at least one error input from a respective error transducer and having a model output outputting a correction signal to a respective output transducer to introduce the respective canceling acoustic wave, each channel model having a recursive transfer function, and wherein said correction signal from the respective model output to the respective output transducer is also applied to the respective recursive transfer function for said channel model such that the signal applied to the respective output transducer is the same signal applied to the respective recursive transfer function, wherein at least one of said channel models has a plurality of recursive transfer functions, one for itself and one for at least one of the remaining channel models.

9. The system according to claim 8 wherein said correction signal from the respective said channel model output to the respective said output transducer is applied to a respective said recursive transfer function in at least one of the remaining channel models.

10. A multi-channel active acoustic attenuation system for attenuating an input acoustic wave, comprising:

at least one output transducer introducing at least one respective canceling acoustic wave to attenuate said input acoustic wave and yield an attenuated output acoustic wave;

at least one error transducer sensing said output acoustic wave and providing at least one respective error signal;

a plurality of adaptive filter channel models, each having at least one error input from a respective said error transducer and having a model output outputting a correction signal to a respective said output transducer to introduce the respective said canceling acoustic wave, each channel model having at least one direct transfer function having an output, and having a plurality of recursive transfer functions having outputs summed with each other and summed with said output of said direct transfer function to yield a resultant sum which is said correction signal.

11. The system according to claim 10 wherein said resultant sum is input to one of said recursive transfer functions of the respective said channel model.

12. The system according to claim 10 wherein said resultant sum is also input to one of the recursive transfer functions of at least one of the remaining channel models.

13. A multi-channel active acoustic attenuation system for attenuating an input acoustic wave, comprising:

at least one input transducer sensing said input acoustic wave;

at least one output transducer introducing at least one respective canceling acoustic wave to attenuate said input acoustic wave and yield an attenuated output acoustic wave;

at least one error transducer sensing said output acoustic wave and providing at least one respective error signal;

a plurality of adaptive filter channel models, each channel model having at least one error input from a respective said error transducer, each channel model having a model output outputting a correction signal to a respective said output transducer to introduce the respective said canceling acoustic wave, each channel model having a first set of at least one model input from a respective said input transducer, each channel model having a second set of model inputs from respective model outputs of the remaining channel models.

14. The system according to claim 13 wherein each said channel model comprises first and second algorithm means each having an error input from each of said error transducers.

15. The system according to claim 13 wherein:

a first of said channel models comprises:

first algorithm means having a first input from a first of said input transducers, a plurality of error inputs, one for each of said error transducers and receiving respective error signals therefrom, and an output;

second algorithm means having a first input from the correction signal from said first channel model to a first of said output transducers, a plurality of error inputs, one for each of said error transducers and receiving respective error signals therefrom, and an output;

summing means having inputs from said outputs of said first and second algorithm means of said first channel model, and an output providing said correction signal from said first channel model to said first output transducer;

a second of said channel models comprises:

first algorithm means having a first input from a second of said input transducers, a plurality of error inputs, one for each of said error transducers and receiving respective error signals therefrom, and an output;

second algorithm means having a first input from the correction signal from said second channel model to a second of said output transducers, a plurality of error inputs, one for each of said error transducers and receiving respective error signals therefrom, and an output;

summing means having inputs from said outputs of said first and second algorithm means of said second channel model, and an output providing said correction signal from said second channel model to said second output transducer.

16. The system according to claim 15 wherein:

said first channel model comprises:

third algorithm means having a first input from said second input transducer, a plurality of error inputs, one for each of said error transducers and receiving respective error signals therefrom, and an output summed at said summing means of said first model;

fourth algorithm means having a first input from said correction signal from said second channel model to said second output transducer, a plurality of error inputs, one for each of said error transducers and receiving respective error signals therefrom, and an output summed at said summing means of said first channel model; said second channel model comprises:

third algorithm means having a first input from said first input transducer, a plurality of error inputs, one for each of said error transducers and receiving respective error signals therefrom, and an output summed at said summing means of said second channel model;

fourth algorithm means having a first input from said correction signal from said first channel model to said first output transducer, a plurality of error inputs, one for each of said error transducers and receiving respective error signals therefrom, and an output summed at said summing means of said second channel model.

17. A multi-channel active acoustic attenuation system for attenuating an input acoustic wave, comprising:

a plurality of input transducers sensing said input acoustic wave;

a plurality of output transducers introducing respective canceling acoustic waves to attenuate said input acoustic wave;

a plurality of error transducers sensing said output acoustic wave and providing respective error signals;

a plurality of adaptive filter channel models, each having model inputs from said input transducers and having a model output outputting a correction signal to a respective said output transducer to introduce the respective said canceling acoustic wave, each channel model comprising first and second algorithm means each having an error input from each of said error transducers, wherein:

said first algorithm means of a first of said channel models comprises a first set of error path models of error paths between a first of said output transducers and each of said error transducers, a first error path model of said first set having an input from a first of said input transducers, and having an output multiplied with the error signal from a first of said error transducers to provide a resultant product which is summed at a first summing junction of said first channel model, a second error path model of said first set having an input from said first input transducer, and having an output multiplied with the error signal from a second of said error transducers to provide a resultant product which is summed at said first summing junction of said first channel model, the output of said first summing junction of said first channel model providing a weight update to said first algorithm means of said first channel model;

said second algorithm means of said first channel model comprises a second set of error path models of said error paths between said first output transducer and each of said error transducers, a first error path model of said second set having an input from said correction signal of said first channel model applied to a first of said output transducers, and having an output multiplied with the error signal from said first error transducer to provide a resultant product which is summed at a second summing junetion of said first channel model, a second error path model of said second set having an input from said correction signal of said first channel model applied to said first output transducer, and having an output multiplied with the error signal from said second error transducer to provide a resultant product which is summed at said second summing junction of said first channel model, the output of said second summing junction of said first channel model providing a weight update to said second algorithm means of said first channel model;

said first algorithm means of a second of said channel models comprises a third set of error path models of error paths between a second of said output transducers and each of said error transducers, a first error path model of said third set having an input from a second of said input transducers, and having an output multiplied with the error signal from said first error transducer to provide a resultant product which is summed at a first summing junction of said second channel model, a second error path model of said third set having an input from said second input transducer, and having an output multiplied with the error signal from said second error transducer to provide a resultant product which is summed at said first summing junction of said second channel model, the output of said first summing junction of said second channel model providing a weight update to said first algorithm means of said second channel model;

said second algorithm means of said second channel model comprises a fourth set of error path models of said error paths between a second of said output transducers and each of said error transducers, a first error path model of said fourth set having an input from said correction signal of said second channel model applied to said second output transducer, and having an output multiplied with the error signal from said first error transducer to provide a resultant product which is summed at a second summing junction of said second channel model, a second error path model of said fourth set having an input from said correction signal of said second channel model applied to said second output transducer, and having an output multiplied with the error signal from said second error transducer to provide a resultant product which is summed at said second summing junction of said second channel model, the output of said second summing junction of said second channel model providing a weight update to said second algorithm means of said second channel model.

18. A multi-channel active acoustic attenuation system for attenuating an input acoustic wave, comprising:

a plurality of input transducers sensing said input acoustic wave;

a plurality of output transducers introducing respective canceling acoustic waves to attenuate said input acoustic wave and yield an attenuated output acoustic wave;

a plurality of error transducers sensing said output acoustic wave and providing respective error signals;

a plurality of adaptive filter channel models, each having a model output outputting a correction signal to a respective said output transducer to introduce the respective said canceling acoustic wave, a first set of inputs from said input transducers, and a second set of inputs from the model outputs of the remaining channel models, wherein:

a first of said channel models comprises:

first algorithm means having a first input from a first of said input transducers, a plurality of error inputs, one for each of said error transducers and receiving respective error signals therefrom, and an output;

second algorithm means having a first input from the correction signal from said first channel model to a first of said error transducers, a plurality of error inputs, one for each of said error transducers and receiving respective error signals therefrom, and an output;

third algorithm means having a first input from a second of said input transducers, a plurality of error inputs, one for each of said error transducers and receiving respective error signals therefrom, and an output;

fourth algorithm means having a first input from the correction signal from a second of said channel models to a second of said output transducers, a plurality of error inputs, one for each of said error transducers and receiving respective error signals therefrom, and an output;

summing means having inputs from said outputs of said first, second, third, and fourth algorithm means of said first channel model, and an output providing said correction signal from said first channel model to said first output transducer;

said first algorithm means of said first channel model comprising a first set of error path models of error paths between said first output transducer and each of said error transducers, a first error path model of said first set having an input from said first input transducer, and having an output multiplied with the error signal from said first error transducer to provide a resultant product which is summed at a first summing junction of said first channel model, a second error path model of said first set having an input from said first input transducer, and having an output multiplied with the error signal from said second error transducer to provide a resultant product which is summed at said first summing junction of said first channel model, the output of said first summing junction of said first channel model providing a weight update to said first algorithm means of said first channel model;

said second algorithm means of said first channel model comprising a second set of error path models of said error paths between said first output transducer and each of said error transducers, a first error path model of said second set having an input from said correction signal of said first model applied to said first output transducer, and having an output multiplied with the error signal from said first error transducer to provide a resultant product which is summed at a second summing junction of said first channel model, a second error path model of said second set having an input from said correction signal of said first channel model applied to said first output transducer, and having an output multiplied with the error signal from said second error transducer to provide a resultant product which is summed at said second summing junction of said first channel model, the output of said second summing junction of said first channel model providing a weight update to said second algorithm means of said first channel model;

said third algorithm means of said first channel model comprising a third set of error path models of error paths between said first output transducer and each of said error transducers, a first error path model of said third set having an input from said second input transducer, and having an output multiplied with the error signal from said first error transducer to provide a resultant product which is summed at a third summing junction of said first channel model, a second error path model of said third set having an input from said second input transducer, and having an output multiplied with the error signal from said second error transducer to provide a resultant product which is summed at said third summing junction of said first channel model, the output of said third summing junction of said first channel model providing a weight update to said third algorithm means of said first channel model;

said fourth algorithm means of said first channel model comprising a fourth set of error path models of said error paths between said second output transducer and each of said error transducers, a first error path model of said fourth set having an input from said correction signal of said second channel model applied to said second output transducer, and having an output multiplied with the error signal from said first error transducer to provide a resultant product which is summed at a fourth summing junction of said first channel model, a second error path model of said fourth set having an input from said correction signal of said second channel model applied to said second output transducer, and having an output multiplied with the error signal from said second error transducer to provide a resultant product which is summed at said fourth summing junction of said first channel model, the output of said fourth summing junction of said first channel model providing a weight update to said fourth algorithm means of said first channel model;

a second of said channel models comprises:

first algorithm means having a first input from said second input transducer, a plurality of error inputs, one for each of said error transducers and receiving respective error signals therefrom, and an output;

second algorithm means having a first input from said correction signal from said second channel model to said second error transducer, a plurality of inputs, one for each of said error transducers and receiving respective error signals therefrom, and an output;

third algorithm means having a first input from said first input transducer, a plurality of error inputs, one for each of said error transducers and receiving respective error signals therefrom, and an output;

fourth algorithm means having a first input from said correction signal from said first channel model to said first output transducer, a plurality of error inputs, one for each of said error transducers and receiving respective error signals therefrom, and an output;

summing means having inputs from said outputs of said first, second, third and fourth algorithm means of said second channel model, and an output providing said correction signal from said second channel model to said second output transducer;

said first algorithm means of said second channel model comprises a fifth set of error path models of error paths between said second output transducer and each of said error transducers, a first error path model of said fifth set having an input from said second input transducer, and having an output multiplied with the error signal from said first error transducer to provide a resultant product which is summed at a first summing junction of said second channel model, a second error path model of said fifth set having an input from said second input transducer, and having an output multiplied with said error signal from said second error transducer to provide a resultant product which is summed at said first summing junction of said second channel model, the output of said first summing junction of said second channel model providing a weight update to said first algorithm means of said second channel model;

said second algorithm means of said second channel model comprises a sixth set of error path models of said error paths between said second output transducer and each of said error transducers, a first error path model of said sixth set having an input from said correction signal of said second channel model applied to said second output transducer, and having an output multiplied with said error signal from said first error transducer to provide a resultant product at a second summing junction of said second channel model, a second error path model of said sixth set having an input from said correction signal of said second channel model applied to said second output transducer, and having an output multiplied with said error signal from said second error transducer to provide a resultant product which is summed at said second summing junction of said second channel model, the output of said second summing junction of said second channel model providing a weight update to said second algorithm means of said second channel model;

said third algorithm means of said second channel model comprises a seventh set of error path models of error paths between said second output transducer and each of said error transducers, a first error path model of said seventh set having an input from said first input transducer, and having an output multiplied with the error signal from said first error transducer to provide a resultant product which is summed at a third summing junction of said second channel model, a second error path model of said seventh set having an input from said first input transducer, and having an output multiplied with said error signal from said second error transducer to provide a resultant product which is summed at said third summing junction of said second channel model, the output of said third summing junction of said second channel model providing a weight update to said third algorithm means of said second channel model;

said fourth algorithm means of said second channel model comprises an eighth set of error path models of error paths between said second output transducer and each of said error transducers, a first error path model of said eighth set having an input from said correction signal of said first channel model applied to said first output transducer, and an output multiplied with said error signal from said first error transducer to provide a resultant product at a fourth summing junction of said second channel model, a second error path model of said eighth set having an input from said correction signal of said first channel model applied to said first output transducer, and having an output multiplied with said error signal from said second error transducer to provide a resultant product which is summed at said fourth summing junction of said second channel model, the output of said fourth summing junction of said second channel model providing a weight update to said fourth algorithm means of said second channel model.

19. A multi-channel active acoustic attenuation method for attenuating an input acoustic wave, comprising:

introducing at least one canceling acoustic wave from at least one respective output transducer to attenuate said input acoustic wave and yield an attenuated output acoustic wave;

sensing said output acoustic wave with at least one error transducer and providing at least one error signal;

providing a plurality of adaptive filter channel models, each having at least one error input from a respective error transducer and each having a model output outputting a correction signal to a respective output transducer to introduce the respective canceling acoustic wave, providing at least one of said channel models with a model input from at least one of the remaining channel models.

20. The method according to claim 19 comprising inputting said correction signal from said model output to the respective output transducer and also inputting said correction signal to at least one of the remaining channel models.

21. A multi-channel active acoustic attenuation method for attenuating an input acoustic wave, comprising:

introducing at least one canceling acoustic wave from at least one respective output transducer to attenuate said input acoustic wave and yield an attenuated output acoustic wave;

sensing said output acoustic wave with at least one error transducer and providing at least one respective error signal;

providing a plurality of adaptive filter channel models, each having at least one error input from a respective error transducer and each having a model output outputting a correction signal to a respective said output transducer to introduce the respective said canceling acoustic wave;

providing each said channel model with a model input from each of the remaining channel models.

22. The method according to claim 21 comprising inputting said correction signal from said model output to the respective output transducer and also inputting said correction signal to reach of the remaining channel models.

23. A multi-channel active acoustic attenuation method for attenuating an input acoustic wave, comprising:

introducing at least one canceling acoustic wave from at least one respective output transducer to attenuate said input acoustic wave and yield an attenuated output acoustic wave;

sensing said output acoustic wave with at least one error transducer and providing at least one respective error signal;

providing a plurality of adaptive filter channel models, each having at least one error input from a respective error transducer and each having a model output outputting a correction signal to a respective said output transducer to introduce the respective said canceling acoustic wave;

inputting the error signal from each error transducer to each of said channel models.

24. A multi-channel active acoustic attenuation method for attenuating an input acoustic wave, comprising:

introducing at least one canceling acoustic wave from at least one respective output transducer to attenuate said input acoustic wave and yield an attenuated output acoustic wave;

sensing said output acoustic wave with at least one error transducer and providing at least one respective error signal;

providing a plurality of adaptive filter channel models, each having at least one error input from a respective error transducer and each having a model output outputting a correction signal to a respective said output transducer to introduce the respective said canceling acoustic wave;

wherein there are a plurality of error paths, including a first set of error paths between a first of said output transducers and each error transducer, a second set of error paths between a second of said output transducers and each error transducer, and comprising updating each channel model for each error path of a given set from a given output transducer.

25. A multi-channel active acoustic attenuation method for attenuating an input acoustic wave, comprising:

introducing at least one canceling acoustic wave from at least one respective output transducer to attenuate said input acoustic wave and yield an attenuated output acoustic wave;

sensing said output acoustic wave with at least one error transducer and providing at least one respective error signal;

providing a plurality of adaptive filter channel models, each having at least one error input from a respective error transducer and each having a model output outputting a correction signal to a respective said output transducer to introduce the respective said canceling acoustic wave;

providing said plurality of adaptive filter channel models by first and second channel models, providing said first channel model with a model input from said second channel model, providing said second channel model with a model input from said first channel model, inputting a first said correction signal from said first model output to the respective output transducer and also inputting said first correction signal to said second channel model, inputting a second said correction signal from said second model output to the respective output transducer and also inputting said second correction signal to said first channel model.

26. A multi-channel active acoustic attenuation method for attenuating an input acoustic wave, comprising:

introducing at least one canceling acoustic wave from at least one respective output transducer to attenuate said input acoustic wave and yield an attenuated output acoustic wave;

sensing said output acoustic wave with at least one error transducer and providing at least one respective error signal;

providing a plurality of adaptive filter channel models, each having at least one error input from a respective error transducer and each having a model output outputting a correction signal to a respective output transducer to introduce the respective canceling acoustic wave;

providing each channel model with a recursive transfer function;

applying said correction signal from the respective said model output to the respective said output transducer and also applying said correction signal to the respective said recursive transfer function for said channel model such that the signal applied to the respective said output transducer is the same signal applied to the respective said recursive transfer function, providing at least one of said channel models with a plurality of recursive transfer functions, one for itself and one for at least one of the remaining channel models.

27. The method according to claim 26 comprising applying said correction signal from the respective said model output to the respective said output transducer and also applying said correction signal to a respective said recursive transfer function in at least one of the remaining channel models.

28. A multi-channel active acoustic attenuation method for attenuating an input acoustic wave, comprising:

introducing at least one canceling acoustic wave from at least one respective output transducer to attenuate said input acoustic wave and yield an attenuated output acoustic wave;

sensing said output acoustic wave with at least one error transducer and providing at least one respective error signal;

providing a plurality of adaptive filter channel models, each having at least one error input from a respective said error transducer and each having a model output outputting a correction signal to a respective said output transducer to introduce the respective said canceling acoustic wave;

providing each channel model with a plurality of direct transfer functions;

summing the outputs of said direct transfer functions with each other;

providing each channel model with a plurality of recursive transfer functions;

summing the outputs of said recursive transfer functions with each other and with the summed outputs of said direct transfer functions and providing the resultant sum as said correction signal.

29. The method according to claim 28 comprising inputting said resultant sum to one of said recursive transfer functions of the respective said channel model.

30. The method according to claim 29 comprising also inputting said resultant sum to one of the recursive transfer functions of each remaining channel model.

31. A multi-channel active acoustic attenuation method for attenuating an input acoustic wave, comprising:

sensing said input acoustic wave with at least one input transducer;

introducing at least one canceling acoustic wave from at least one respective output transducer to attenuate said input acoustic wave and yield an attenuated output acoustic wave;

sensing said output acoustic wave with at least one error transducer and providing at least one respective error signal;

providing a plurality of adaptive filter channel models, each channel model having at least one error input from a respective said error transducer, each channel model having a model output outputting a correction signal to a respective said output transducer to introduce the respective said canceling acoustic wave, providing each channel model with a first set of at least one model input from a respective said input transducer, providing each channel model with a second set of model inputs from respective model outputs of the remaining channel models.

32. The method according to claim 31 comprising providing each channel model with first and second algorithm means each having an error input from each of said error transducers.

33. The method according to claim 31 comprising:

providing a first of said channel models with first algorithm means having a first input from a first of said input transducers, a plurality of error inputs, one for each of said error transducers and receiving respective error signals therefrom, and an output;

providing said first channel model with second algorithm means having a first input from the correction signal from said first channel model to a first of said output transducers, a plurality of error inputs, one for each of said error transducers and receiving respective error signals therefrom, and an output;

summing the outputs of said first and second algorithm means of said first channel model and providing the resultant sum as said correction signal from said first channel model to said first output transducer;

providing a second of said channel models with first algorithm means having a first input from a second of said input transducers, a plurality of error inputs, one for each of said error transducers and receiving respective error signals therefrom, and an output;

providing said second channel model with second algorithm means having a first input from the correction signal from said second channel model to a second of said output transducers, a plurality of error inputs, one for each of said error transducers and receiving respective error signals therefrom, and an output;

summing the outputs of said first and second algorithm means of said second channel model and providing the resultant sum as said correction signal from said second channel model to said second output transducer.

34. The method according to claim 33 comprising:

providing said first channel model with third algorithm means having a first input from said second input transducer, a plurality of error inputs, one for each of said error transducers and receiving respective error signals therefrom, and an output;

summing the output of said third algorithm means of said first channel model with said outputs of said first and second algorithm means of said first channel model;

providing said first channel model with fourth algorithm means having a first input from said correction signal from said second channel model to said second output transducer, a plurality of error inputs, one for each of said error transducers and receiving respective error signals therefrom, and an output;

summing said output of said fourth algorithm means of said first channel model with said outputs of said first, second and third algorithm means of said first channel model;

providing said second channel model with third algorithm means having a first input from said first input transducer, a plurality of error inputs, one for each of said error transducers and receiving respective error signals therefrom, and an output;

summing said output of said third algorithm means of said second channel model with said outputs of said first and second algorithm means of said second channel model;

providing said second channel model with fourth algorithm means having a first input from said correction signal from said first channel model to said first output transducer, a plurality of error inputs, one for each of said error transducers and receiving respective error signals therefrom, and an output;

summing said output of said fourth algorithm means of said second channel model with said outputs of said first, second and third algorithm means of said second channel model.

35. A multi-channel active acoustic attenuation method for attenuating an input acoustic wave, comprising:

sensing said input acoustic wave with a plurality of input transducers;

introducing canceling acoustic waves from a plurality of output transducers to attenuate said input acoustic wave and yield an attenuated output acoustic wave;

sensing said output acoustic wave with a plurality of error transducers and providing respective error signals;

providing a plurality of adaptive filter channel models, each having model inputs from respective said input transducers and each having a model output outputting a correction signal to a respective said output transducer to introduce the respective said canceling acoustic wave;

providing each channel model with first and second algorithm means each having an error input from each of said error transducers;

providing said first algorithm means of a first of said channel models with a first set of error path models of error paths between a first of said output transducers and each of said error transducers, providing a first error path model of said first set with an input from a first of said input transducers, and with an output multiplied by the error signal from a first of said error transducers and providing a resultant product summed at a first summing junction of said first channel model, providing a second error path model of said first set with an input from said first input transducer, and with an output multiplied by the error signal from a second of said error transducers and providing a resultant product summed at said first summing junction of said first channel model, providing the output of said first summing junction of said first channel model as a weight update to said first algorithm means of said first channel model;

providing said second algorithm means of said first channel model with a second set of error path models of said error paths between said first output transducer and each of said error transducers, providing a first error path model of said second set with an input from said correction signal of said first channel model applied to a first of said output transducers, and with an output multiplied by the error signal from said first error transducer and providing a resultant product summed at a second summing junction of said first channel model, providing a second error path model of said second set with an input from said correction signal of said first channel model applied to said first output transducer, and with an output multiplied by the error signal from said second error transducer and providing a resultant product summed at said second summing junction of said first channel model, providing the output of said second summing junction of said first channel model as a weight update to said second algorithm means of said first channel model;

providing said first algorithm means of a second of said channel models with a third set of error path models of error paths between a second of said output transducers and each of said error transducers, providing a first error path model of said third set with an input from a second of said input transducers, and with an output multiplied by the error signal from said first error transducer and providing a resultant product summed at a first summing junction of said second channel model, providing a second error path model of said third set with an input from said second input transducer, and with an output multiplied by the error signal from said second error transducer and providing a resultant product summed at said first summing junction of said second channel model, providing the output of said first summing junction of said second channel model as a weight update to said first algorithm means of said second channel model;

providing said second algorithm means of said second channel model with a fourth set of error path models of said error paths between a second of said output transducers and each of said error transducers, providing a first error path model of said fourth set with an input from said correction signal of said second channel model applied to said second output transducer, and with an output multiplied by the error signal from said first error transducer and providing a resultant product summed at a second summing junction of said second channel model, providing a second error path model of said fourth set with an input from said correction signal of said second channel model applied to said second output transducer, and with an output multiplied by the error signal from said second error transducer and providing a resultant product summed at said second summing junction of said second channel model, providing the output of said second summing junction of said second channel model as a weight update to said second algorithm means of said second channel model.

* * * * *